(12) United States Patent
Reichenbach et al.

(10) Patent No.: US 8,049,580 B2
(45) Date of Patent: Nov. 1, 2011

(54) MEMS CONTROLLED OSCILLATOR

(75) Inventors: Robert B. Reichenbach, Portland, OR (US); Keith Aubin, Coventry, RI (US); Maxim Zalalutdinov, Silver Springs, MD (US); Jeevak M. Parpia, Ithaca, NY (US); Harold G. Craighead, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 0 days.

(21) Appl. No.: 12/938,126

(22) Filed: Nov. 2, 2010

(65) Prior Publication Data

US 2011/0043405 A1    Feb. 24, 2011

Related U.S. Application Data

(63) Continuation of application No. 11/598,097, filed on Nov. 9, 2006, now Pat. No. 7,843,283.

(60) Provisional application No. 60/734,836, filed on Nov. 9, 2005.

(51) Int. Cl.
*H03H 9/00* (2006.01)
*H01P 7/00* (2006.01)

(52) U.S. Cl. ........................................ 333/186; 333/197

(58) Field of Classification Search .................. 333/186, 333/197, 198, 199; 331/154
See application file for complete search history.

(56) References Cited

U.S. PATENT DOCUMENTS

| | | |
|---|---|---|
| 2,716,887 A | 9/1955 | Smith |
| 4,306,456 A | 12/1981 | Maerfeld |
| 4,355,286 A | 10/1982 | Knobbe et al. |
| 4,430,895 A | 2/1984 | Colton |
| 4,450,377 A | 5/1984 | Briese |
| 4,562,740 A | 1/1986 | Webber et al. |
| 4,598,587 A | 7/1986 | Dwyer et al. |
| 4,607,341 A | 8/1986 | Monchalin |
| 5,020,370 A | 6/1991 | Deval et al. |
| 5,025,346 A | 6/1991 | Tang et al. |

(Continued)

FOREIGN PATENT DOCUMENTS

JP    2002229086    8/2002

OTHER PUBLICATIONS

Zalalutdinov et al., Light-activated self-generation and parametric MEMS oscillators, Oct. 2001, SPIE vol. 4561, pp. 189-200.*

(Continued)

*Primary Examiner* — Dean Takaoka
(74) *Attorney, Agent, or Firm* — Schwegman, Lundberg & Woessner, P.A.

(57) ABSTRACT

An array of micromechanical oscillators have different resonant frequencies based on their geometries. In one embodiment, a micromechanical oscillator has a resonant frequency defined by an effective spring constant that is modified by application of heat. In one embodiment, the oscillator is disc of material supported by a pillar of much smaller diameter than the disc. The periphery of the disc is heated to modify the resonant frequency (or equivalently the spring constant or stiffness) of the disc. Continuous control of the output phase and frequency may be achieved when the oscillator becomes synchronized with an imposed sinusoidal force of close frequency. The oscillator frequency can be detuned to produce an easily controlled phase differential between the injected signal and the oscillator feedback. A phased array radar may be produced using independent phase controllable oscillators.

19 Claims, 6 Drawing Sheets

U.S. PATENT DOCUMENTS

| | | | |
|---|---|---|---|
| 5,063,782 A | 11/1991 | Kellett | |
| 5,090,254 A | 2/1992 | Guckel et al. | |
| 5,267,471 A | 12/1993 | Abraham et al. | |
| 5,352,635 A | 10/1994 | Tu et al. | |
| 5,450,751 A | 9/1995 | Putty et al. | |
| 5,719,324 A | 2/1998 | Thundat et al. | |
| 5,804,709 A | 9/1998 | Bourgoin et al. | |
| 5,839,062 A | 11/1998 | Nguyen et al. | |
| 5,856,722 A | 1/1999 | Haronian et al. | |
| 5,889,357 A | 3/1999 | Yachi et al. | |
| 5,909,456 A | 6/1999 | Oka | |
| 6,006,593 A | 12/1999 | Yamanaka | |
| 6,035,719 A | 3/2000 | Toyota | |
| 6,124,933 A | 9/2000 | Mizutani et al. | |
| 6,134,257 A | 10/2000 | Capasso et al. | |
| 6,363,090 B1 | 3/2002 | Wintner et al. | |
| 6,369,374 B1 | 4/2002 | Greywall | |
| 6,497,141 B1 | 12/2002 | Turner et al. | |
| 6,628,177 B2 | 9/2003 | Clark et al. | |
| 6,630,871 B2 | 10/2003 | Ma et al. | |
| 6,788,175 B1 | 9/2004 | Prophet | |
| 6,834,064 B1 | 12/2004 | Paschotta et al. | |
| 6,859,113 B2 | 2/2005 | Giousouf et al. | |
| 6,903,489 B2 | 6/2005 | Suzuki et al. | |
| 7,215,061 B2 | 5/2007 | Kihara et al. | |
| 7,654,140 B2 | 2/2010 | Zalalutdinov et al. | |
| 2003/0085779 A1 | 5/2003 | Ma et al. | |
| 2003/0173864 A1 | 9/2003 | Zalalutdinov et al. | |
| 2004/0055380 A1 | 3/2004 | Shcheglov et al. | |
| 2005/0225413 A1 | 10/2005 | Kozicki et al. | |
| 2006/0162455 A1 | 7/2006 | Kawakatsu | |
| 2007/0200648 A1 | 8/2007 | Reichenbach et al. | |
| 2007/0269901 A1 | 11/2007 | Armani | |

OTHER PUBLICATIONS

"U.S. Appl. No. 10/097,178, Response filed Oct. 14, 2008 to Final Office Action mailed Jul. 17, 2008", 9.

"U.S. Appl. No. 10/097,178, Supplemental Response filed Jan. 8, 2009 to Advisory Action mailed Nov. 24, 2008 and Final Office Action mailed Jul. 17, 2008", 9.

"U.S. Appl. No. 10/097,178, Amendment and Response filed Feb. 19, 2008 to Office Action mailed Oct. 19, 2007.", 10.

"U.S. Appl. No. 10/097,178 Response filed Jul. 29, 2009 to Office Action mailed Mar. 25, 2009.", 12.

"U.S. Appl. No. 10/097,178, Non-Final Office Action mailed Mar. 25, 2009", 12 pgs.

"U.S. Appl. No. 10/097,178, Notice of Allowance mailed Sep. 16, 2009", 7 Pgs.

"U.S. Appl. No. 10/097,178, Response filed Jul. 29, 2009 to Non Final Office Action mailed Mar. 25, 2009", 7 pgs.

"U.S. Appl. No. 11/598,097 Notice of Allowance mailed Jul. 26, 2010", 6 pgs.

"U.S. Appl. No. 11/598,097, Non-Final Office Action mailed Mar. 10, 2009", 12 pgs.

"U.S. Appl. No. 11/598,097, Non-Final Office Action mailed Aug. 6, 2009", 9 PGS.

"U.S. Appl. No. 11/598,097, Non-Final Office Action mailed Jan. 19, 2010", 8.

"U.S. Appl. No. 11/598,097, Response filed May 19, 2010 to Non Final Office Action mailed Jan. 19, 2010", 7 pgs.

"U.S. Appl. No. 11/598,097, Response filed Jan. 12, 2009 to the Restriction Requirement mailed Dec. 12, 2009", 6 pgs.

"U.S. Appl. No. 11/598,097, Response filed Dec. 3, 2009 to Non Final Office Action mailed Aug. 6, 2009", 8 pgs.

"U.S. Appl. No. 11/598,097, Response filed Jun. 8, 2009 to Non Final Office Action mailed Mar. 10, 2009", 8 pgs.

"U.S. Appl. No. 10/097,178, Final Office Action mailed Jul. 17, 2008", 12 pgs.

"Non-Final Office Action mailed Oct. 19, 2007, in U.S. Appl. No. 10/097,178", OARN, 10.

Carr, Dustin W, et al., "Measurement of mechanical resonance and losses in nanometer scale silicon wires", Applied Physics Letters, 75(7), (Aug. 16, 1999), 920-922.

Carr, Dustin W, et al., "Parametric amplification in a torsional microresonator", Applied Physics Letters, 77(10), (Sep. 4, 2000), 1545-1547.

Caves, Carlton M, "Quantum limits on noise in linear amplifiers", Physical Review D (Particles and Fields), 26(8), (Oct. 15, 1982), 1817-1839.

Churenkov, A. V, "Photothermal excitation and self-excitation of silicon microresonators", Sensors and Actuators A, 39(2), (Nov. 1993), 141-148.

Dilella, D., et al., "A micromachined magnetic-field sensor based on an electron tunneling displacement transducer", Sensors and Actuators A, A86(1-2), (Oct. 30, 2000), 8-20.

Hsu, Wan-Thai, et al., "A sub-micron capacitive gap process for multiple-metal-electrode lateral micromechanical resonators", Technical Digest. MEMS 2001. 14th IEEE International Conference on Micro Electro Mechanical Systems, (Jan. 21-25, 2001), 349-352.

Ilic, B., "Mechanical resonant immunospecific biological detector", Applied Physics Letters, 77(3), (2000), 450-452.

Liu, Cheng-Hsien, et al., "Characterization of a high-sensitivity micromachined tunneling accelerometer with micro-g resolution", Journal of Microelectromechanical Systems, 7(2), (1998), 235-244.

Lohndrof, Markus, et al., "Microcantilever torque magnetometry of thin magnetic films", Journal of Applied Physics, 87(9), (May 1, 2000), 5995-5997.

Louisell, William H, "Coupled mode and parametric electronics", John Wiley & Sons, Inc., New York, (1960).

Morse, Philip M, "Membranes and Plates", in Vibration and Sound—2nd Edition, Chapter 5, McGraw-Hill Book Company, Inc., New York, (1948), 172-216.

Nguyen, Clark T.C, et al., "Tunable, Switchable, High-Q VHF Microelectromechanical Bandpass Filters", 1999 IEEE International Solid-State Circuits Conference. Digest of Technical Papers. ISSCC. First Edition, (1999), 78-79.

Olkhovets, A., et al., "Non-Degenerate Nanomechanical Parametric Amplifier", Technical Digest. MEMS 2001. 14th IEEE International Conference on Micro Electro Mechanical Systems, (Jan. 21-25, 2001), 298-300.

Rugar, D., et al., "Mechanical parametric amplification and thermomechanical noise squeezing", Physical Review Letters, 67(6), (2000), 699-702.

Sarid, D., In: Scanning Force Microscopy With Applications to Electric, Magnetic and Atomic Forces, Oxford University Press, New York, NY, (1994), 271.

Sidles, J. A, et al., Reviews of Modern Physics, 67(1), (1995), 249-265.

Stowe, T. D, et al., "Attonewton force detection using ultrathin silicon cantilevers", Applied Physics Letters, 71(2), (Jul. 14, 1997), 288-290.

Timoshenko, S., et al., "Effect of Axial Force on Vibrations of Beams", in Vibration Problems in Engineering, 4th Edition, John Wiley & Sons, New York, (1974), 453-455.

Zalalutdinov, M., "Frequency Entrainment for Micromechanical Oscillator", Applied Physics Letters, 83(16), (Oct. 20, 2003), 3281-3283.

Zook, J. David, et al., "Optically Excited Self-Resonant Microbeams", Sensors and Actuators A, 52(1-3), (Mar.-Apr. 1996), 92-98.

\* cited by examiner

MEMS CONTROLLED OSCILLATOR

RELATED APPLICATION

This application is a continuation of U.S. patent application Ser. No. 11/598,097, Filed Nov. 9, 2006 which claims priority to U.S. Provisional Application Ser. No. 60/734,836, filed Nov. 9, 2005 (entitled MEMS CONTROLLED OSCILLATOR). This application is also related to U.S. patent application Ser. No. 10/097,178 (entitled HEAT PUMPED PARAMETRIC MEMS DEVICE, filed Mar. 12, 2002) which are incorporated herein by reference.

GOVERNMENT FUNDING

The invention described herein was made with U.S. Government support under Grant Number DMR-0079992 awarded by National Science Foundation. The United States Government has certain rights in the invention.

BACKGROUND

Frequency entrainment is an interesting phenomena in nonlinear vibrations. It was discovered in the 17$^{th}$ century by Christian Huygens, who remarked that two slightly out of step pendulum-like clocks became synchronized after they were attached to the same thin wooden board. Similar phenomenon, injection locking, was observed in radio frequency (RF) circuits and laser systems.

Entrainment of micromechanical device oscillation has also been achieved in the RF range. Oscillation induced by a continuous wave laser can be entrained to a frequency near the resonant frequency of the micromechanical device by applying a small pilot signal at a frequency close to the resonant frequency, or by modifying the effective spring constant of the resonator by imposing a small RF component on the laser beam intensity. Such oscillations may be difficult to precisely control.

When the mechanical oscillator is synchronized to the pilot signal, the variations in the frequency and phase of the mechanical oscillations are locked to and controlled by the frequency of the pilot oscillator. Such an implementation offers the possibility of phase tuning or modulating the feedback of the mechanical resonance, however it suffers from the lack of a constant RF output frequency which is a requirement for phased array radar or phase modulated communication systems.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

One example microelectromechanical (MEMS) device is first described, followed by a mechanism for entraining oscillations of a MEMS device to a pilot frequency. Methods and devices for controlling the frequency and phase of oscillations is then described, followed by examples of applications with devices having independently controllable frequency and phase.

In one embodiment, continuous control of the output phase and frequency of a micromechanical oscillator may be achieved when the oscillator becomes synchronized with an imposed sinusoidal force of close frequency. The oscillator frequency can be detuned to produce an easily controlled phase differential between the injected signal and the oscillator feedback.

By controlling the DC bias of a self-generating, injection-locked, thermally actuated micromechanical resonator the frequency and phase of the output signal may be continuously varied. An array of such small-sized tunable oscillators provide a compact device for implementing beam steering or beam formation in a phased-array antenna. The ability to produce continuous frequency or phase variations may also be used for applications in wireless communications, where information is encoded in phase or frequency modulated signals. By modulating a DC bias with a baseband signal, the MEMS oscillator can generate a wide bandwidth phase or frequency modulated carrier frequency.

Figure 1:
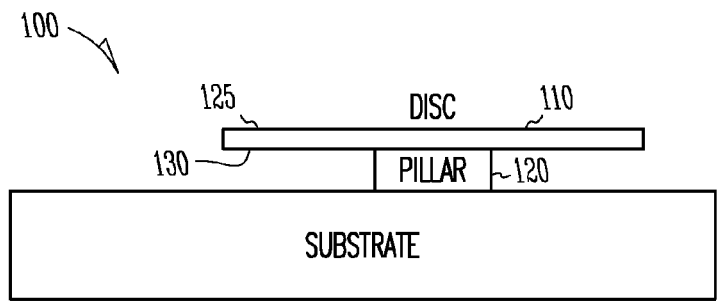
FIG. 1 is a block diagram of a MEMS structure for use as a heat pumped parametric oscillator according to an example embodiment.

FIG. 1 is a side view representation of a micromechanical oscillator 100. It oscillates in the radio frequency (RF) range and is fabricated in the form of a silicon disc 110 supported by a SiO$_2$ pillar 120 at the disc center. Other shapes, such as oval or polygons may also be used, and are included in the use of the term disc. An effective spring constant of this oscillator 100 is controlled within the range) f/f~10$^{-4}$ by a low power laser beam (P$_{laser}$100:W) 125, focused at the periphery 130 of the disc.

Oscillators in the RF range may be obtained. Generally, the smaller the structure, the higher the frequency of oscillation. Modulating the intensity of the focused laser beam 125 provides changes of the effective spring constant of the oscillator. The dc component of the laser beam may be used to detect the vibration (at the fundamental frequency) by interferometric effects.

In still a further embodiment, a bridge structure is used as an oscillator. MEMS bridge structures are well known in the art. In this embodiment, an AC current may be run through the bridge to vary its effective stiffness.

Figure 2A:
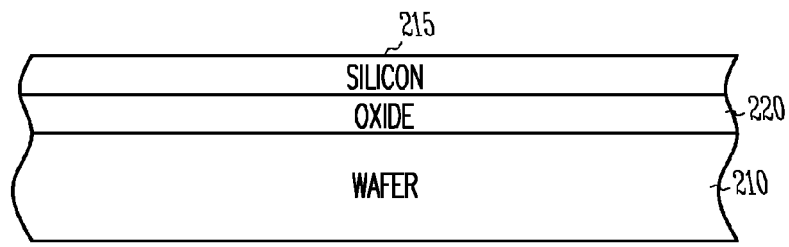
FIGS. 2A, 2B, and 2C illustrate a process of forming the MEMS structure of FIG. 1 according to an example embodiment.
Figure 2B:
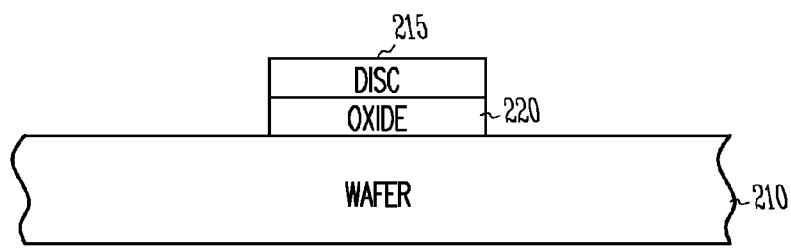
Figure 2C:
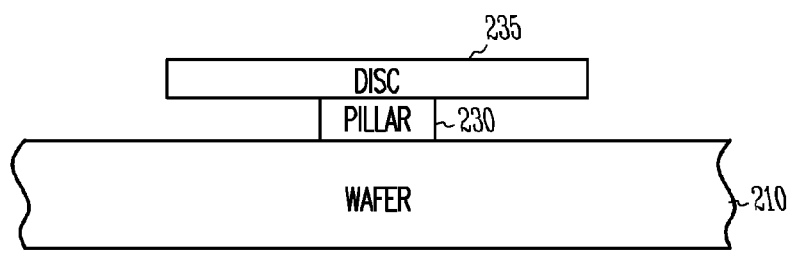

As illustrated in FIG. 2A, commercially available silicon-on-insulator (SOI) wafers 210 with a 250 nm thick silicon layer 215 on top of a 1 micron silicon oxide layer 220 may be used in one embodiment for microfabrication. Other thicknesses of the layers may be used in various embodiments to produce oscillators that have different resonant frequencies. Discs of radius R from 5 to 20 microns may be defined by electron-beam lithography followed by a dry etch through the top silicon layer as shown in FIG. 2B. The radius of the discs also affects the resonant frequency. Dipping the resulting structure into hydrofluoric acid undercuts the silicon oxide starting from the disc's periphery toward the center as shown in FIG. 2C. By timing this wet etch, the diameter of the remaining column of the silicon oxide 230, which supports the released silicon disc 235, is varied. In one embodiment, the diameter of the column is approximately 6.7 microns.

Oscillator 100 is just one example of oscillators that may be used with the present invention. Other types of oscillators, such as cantilevered beams, and bridges may also be used. Other types of mechanical oscillators having resonant frequencies in desired ranges, and some degree of nonlinearity for entrainment may be used.

In one embodiment, a 30 µm diameter polysilicon shell type resonator with resonant modes between 10 and 30 MHz and a mechanical quality factor of ~10,000 may be used. The shell resonator is a circular, 200 nm thick plate, clamped on the periphery and suspended via removal of the sacrificial oxide in the center. Due to compressive stress in the polysilicon film, the circular plate has a convex or concave dome-like curvature, enhancing the resonant frequency of the device and providing a means of thermal actuation.

Figure 3:
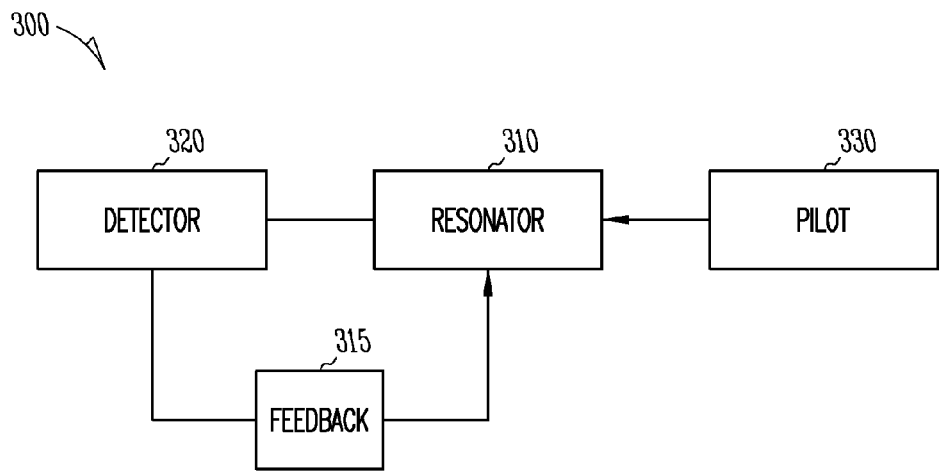
FIG. 3 is a block schematic diagram of a MEMS resonator having a pilot signal for entraining the resonator according to an example embodiment.

FIG. 3 is a block diagram showing entrainment of a resonator device generally at 300. A resonator 310 is coupled to an input signal 315 to initiate oscillation of the resonator 310 about its resonant frequency. The oscillations of the resonator 310 are detected by a detector 320, and fed back through the input 315 to enable the resonator to function as a stable frequency source. At 330, a pilot signal close in frequency to the resonant frequency of the resonator 310 is applied to the resonator, and the resonator entrains to that frequency within milliseconds, depending on how close the pilot frequency is to the resonant frequency, and the Q of the oscillator.

The signals applied to the resonator 310 cause a localized heating of the resonator, causing a deformation of the resonator. They may be applied optically such as by laser, or thermally, such as by resistive heating by microheaters, either directly on the resonator or proximate thereto. Detection of oscillation of the resonator may be obtained by laser, using different forms of interferometry, or by other means, such as piezo resistive mechanisms. Motion can also be produced and detected through electrostatic (also called capacitive) transduction.

In one embodiment, the input 315 of the micromechanical resonator is a 50Ω gold resistor, lithographically defined on the surface of the resonator, such as a dome or shell, which couples Joule heat to mechanical stress in the shell, inducing out-of-plane displacement. The dome resonates when the frequency of the current flowing through the resistor, or microheater matches a resonant mode of the structure. The driving force provided by the thermal actuator is described by (1)

$$F_{\omega_o} \propto V_{RF}^2/R \propto V_{DC}V_o \sin(\omega_o t)/R, \qquad (1)$$

where $\Delta T$ is the local change in temperature and R is the resistance of the actuator.

The small thermal time constant of the thin film resonator allows the local temperature to be modulated and the heat dissipated at a rate comparable to the time constant of mechanical motion at resonance allowing driven resonance and high modulation rates. The resulting motion is detected via detector 320, such as a HeNe laser using the resonator and sacrificial oxide cavity as a Fabry-Perot interferometer. Two resistors connected to independent bonding pads can be defined on the resonator, allowing the possibility of multiple electrically isolated resonator transducers. For two resistors spaced about 20 µm apart, −50 dB of electrical crosstalk may be measured.

Figure 4:
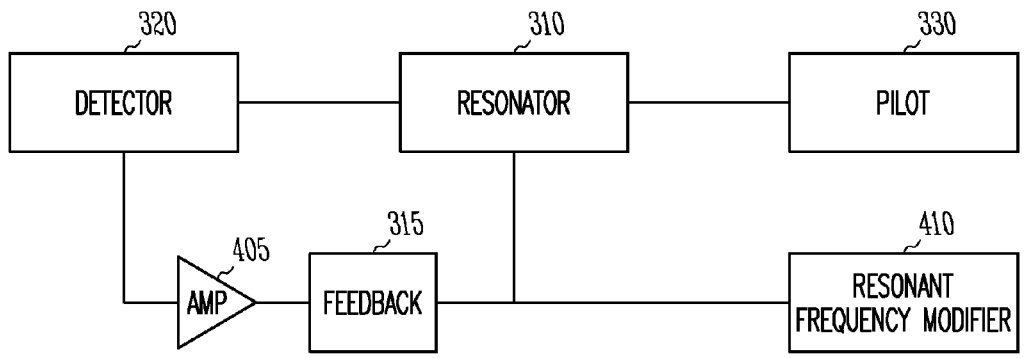
FIG. 4 is a block schematic diagram of a MEMS resonator with entrainment and an adjustable resonant frequency according to an example embodiment.

By applying the laser detected displacement signal as feedback onto the input transducer, the micromechanical dome resonator can function as a stable frequency source. The photodetector signal of detector 320, representing the mechanical motion of the resonator, may be amplified by about 50 dB by an amplifier 405 shown in FIG. 4, depending on the intensity of the detection laser. Other detection methods may be used, such as piezo, capacitive, optical or combinations thereof.

To select the resonator mode of vibration and to provide adjustable in-loop phase, the feedback signal may be filtered by a low-Q band pass element 315. A resonant frequency modifier 410 may be used to modify the resonant frequency of the resonator. In one embodiment, the modifier 410 provides a DC bias less than 1 V, which is superimposed on the feedback signal and subsequently applied to the driving resistor. Limit-cycle oscillations at the free-running frequency, $f_{FR}$, will grow out of the unstable equilibrium point of the system when the feedback network is tuned to provide a gain greater than 1 with a phase shift of an integer multiple of $2\pi$. The amplitude of the oscillations may be limited by the nonlinearity of either the mechanical resonator or the amplifier. A frequency generator with short-term stability of 1.5 ppm may be achieved.

The resonant frequency, $f_o$ of the dome and thus, $f_{FR}$ of the oscillator, can be easily tuned by changing the amount of heat dissipated into the polysilicon film. Steady-state heat, imposed either by the HeNe detection laser or by a DC bias on the thermal actuator, will cause a change in resonator stiffness due to thermal expansion in the film, changing the natural frequency of the shell resonator. Depending on the location of the heat source and the sensitivity of the effective spring constant of a shell resonant mode to thermal expansion, a frequency deviation of 0.35% over a 1V change in DC bias can be achieved.

A weakly non-linear self-oscillatory system can be synchronized to a periodic force superimposed on the system, provided that the natural frequency and the perturbation frequency are not far different. Limit cycle oscillations (in the absence of external forcing) in a micromechanical resonator may be locked in frequency and phase to a small perturbation or pilot signal, $f_{pilot}$, as provided at 330 in FIG. 3, which may be superimposed on the resonator via a modulated laser, resistor, or other means of transferring heat. The MEMS oscillator may be locked with a thermally induced pilot signal 330.

In one embodiment, positive feedback is applied via input 315, causing self-generation at frequency $f_{FR}$. The pilot signal 330 is then used to entrain the oscillator. It is applied to a second input heater on an isolated signal path. The pilot signal may be swept in frequency to establish the region where the mechanical oscillator is entrained. Within the region of entrainment, the resonator oscillations take on the frequency stability of the pilot signal. Hysteresis may be observed between the points where lock is lost (the pull out frequency) on the upward pilot sweep and where lock in resumed on the downward sweep. The perturbation is then incremented in amplitude, which serves to broaden the entrainment region.

Phase lag in the entrained MEMS resonator may be induced by detuning the fundamental frequency of the resonator, $f_o$, with a DC bias via 410. Changing $f_o$ moves the entrainment "V" relative to the pilot signal. To maintain frequency synchronization, the phase of the mechanical vibrations changes according to the phase-frequency function of the resonator. This phase change can be measured between the pilot signal and the self-generation feedback signal. Thus, a phase difference can be obtained by simply changing the magnitude of the voltage impressed on the oscillator rather than requiring a complex method of changing the pilot signal frequency. Furthermore, by changing $f_o$ and not $f_{pilot}$, the output phase can be tuned while $f_{FR}$ remains unchanged.

Figure 5:
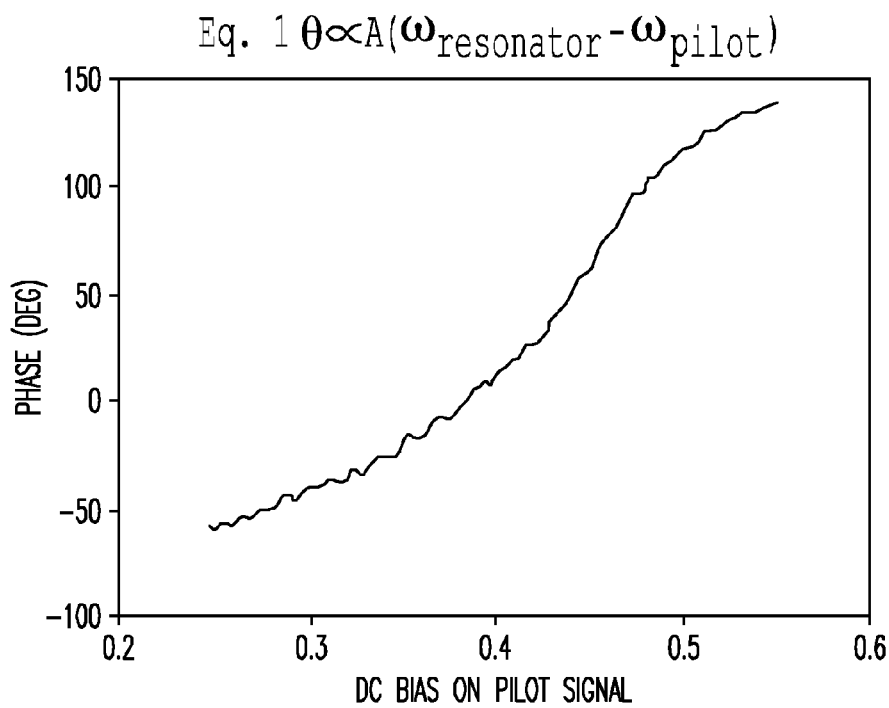
FIG. 5 is a graph depicting phase shift versus bias modifying the resonant frequency of a resonator according to an example embodiment.

FIG. 5 is a graph that illustrates that the total phase shift between $f_{FR}$ and $f_{pilot}$ can be controlled by at least 200°. Beyond this region of DC bias tuning, the region of the entrainment V may be shifted to the extent that the oscillator may lose the lock on the pilot signal, and the entrained condition required to produce the phase differential will collapse, producing quasiperiodic motion. The data is for one particular geometrical configuration of resonator, and is not representative of fundamental limits.

Figure 6:
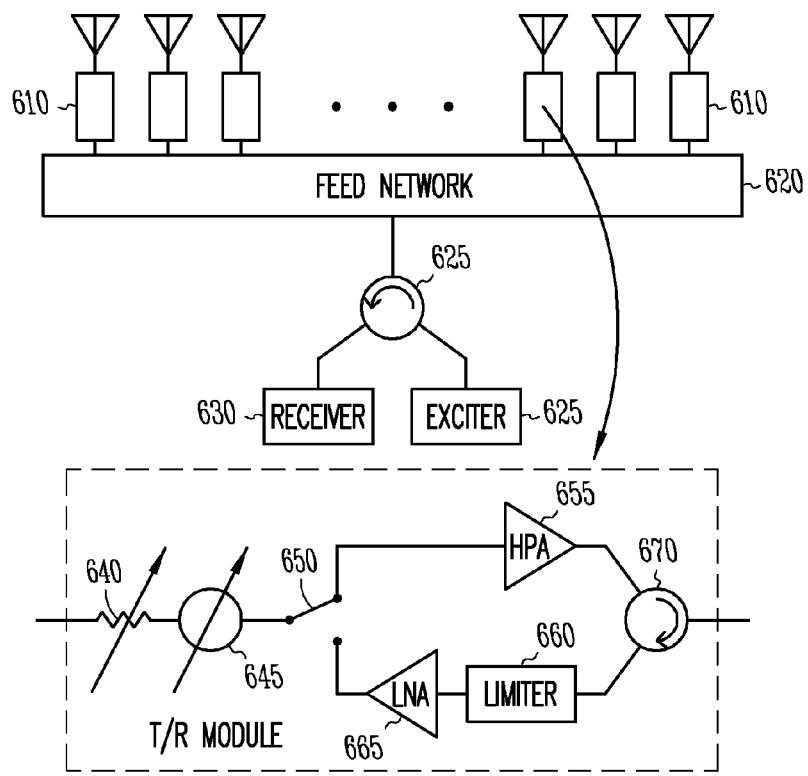
FIG. 6 is a block diagram of a phased array radar system with phase modifiable emitters according to an example embodiment.

FIG. 6 is a block diagram of a phased array radar system 600 with phase modifiable emitters according to an example embodiment. The phase modulated resonator of FIG. 4 may be used to create an array of independently phase modulated elements having antennas, as indicated at 610 in the phased array radar system 600. A feed network 620 is used to couple each of the oscillators to an exciter 625 and emitter 630. These are coupled through a circulator 635, that allows signals to proceed in one direction. Thus, signals from the exciter 625 are fed to the array, while signals received from the array are fed to receiver 630. Each phase modulated element 610 includes a variable resistor 640 and variable phase element 645 selectively coupled via a switch 650 to either a high power amplifier 655 for transmitting signals via the antennas, or receiving signals via a limiter 660 and low noise amplifier 665. Each element 610 also includes a circulator 670 for properly directing signals to be sent and received. Such arrays of emitters provide individually controlled emitter phase.

Figure 7A:
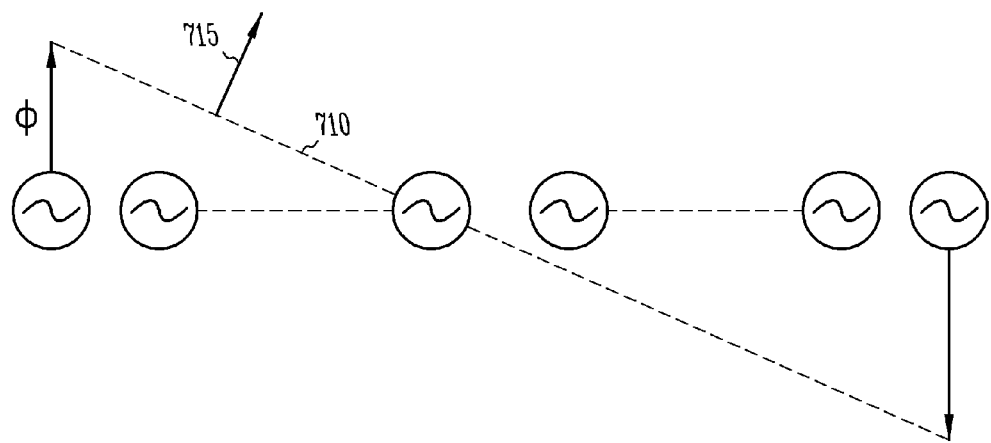
FIGS. 7A, 7B, 7C and 7D are graphical examples of arrays of emitters with different controlled phase changes over the array to shape and control beams according to an example embodiment.

Constructive and destructive interference among the signals radiated by the individual antennas determine the effective radiation pattern of the array. FIGS. 7A, 7B, 7C and 7D are graphical examples of arrays of emitters with different controlled phase changes over the array to shape and control beams according to an example embodiment. FIG. 7A illustrates the phase changing linearly across an array of emitters. The array is represented as a single row of emitters, but may actually consist of a two dimensional array with varying phases. The phase of the emitters is represented by line 710 as linearly changing from left to right across the array. This results in a transmitted signal 715 perpendicular to line 710. The signal 715 is directed toward the right in FIG. 7A.

Figure 7B:
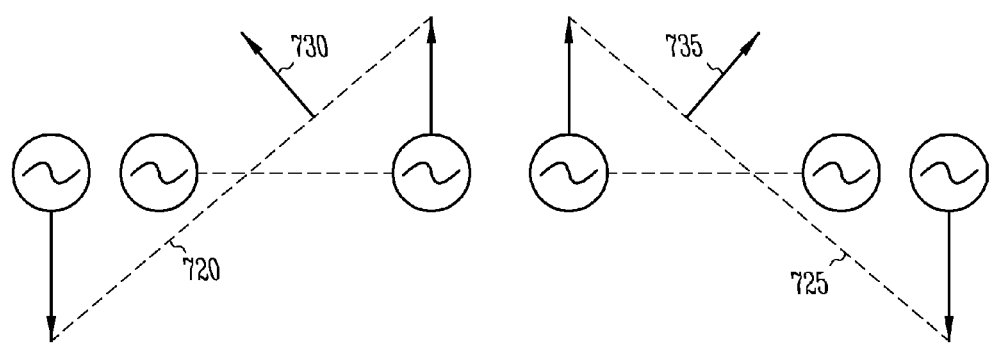
Figure 7C:
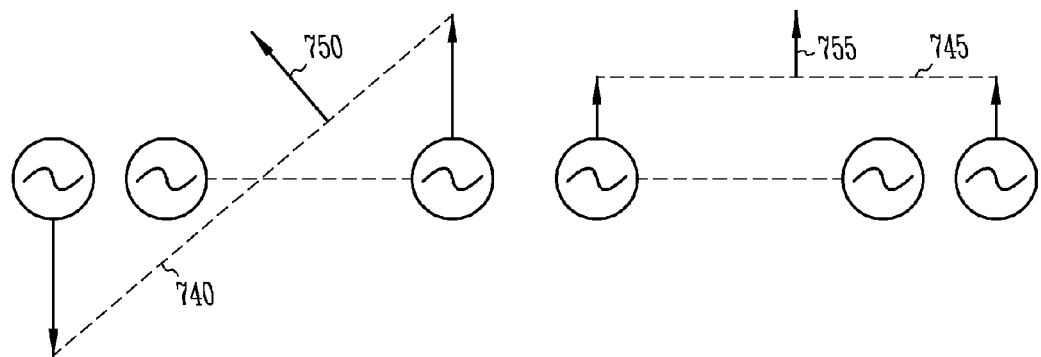
Figure 7D:
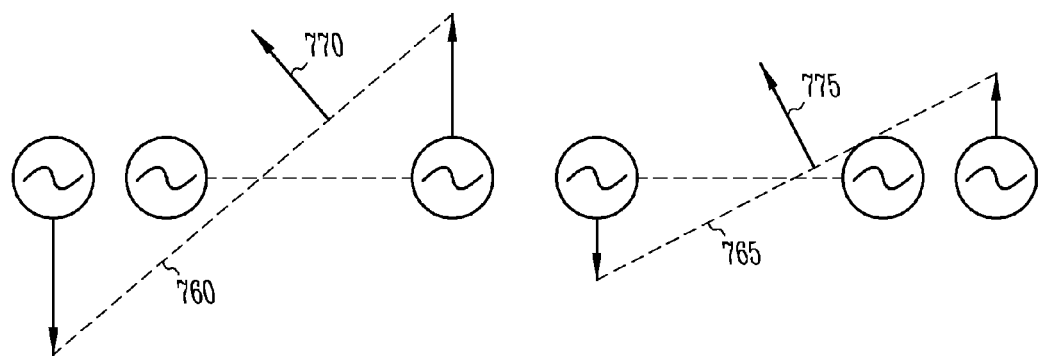

FIG. 7B illustrates an array of emitters wherein two separate linearly changing phases 720 and 725 result in signals being transmitted both left 730 and right 735 respectively from a single array of emitters. FIG. 7C illustrates a further example of the array being split to provide two sets of linear phases, 740 and 745, resulting in one transmitted signal 750 being directed toward the left, and the other transmitted signal 755 being directed straight out from the array. In FIG. 7D, two phases 760 and 765 result in signals being transmitted far left 770, and slightly left 775.

Multiple different phase patterns may be obtained via the independent control over each emitter in the compact package. The phases may be modified real time to beam sculpt and allow the array to track or follow multiple objects moving in different directions. The use of such independently phase adjustable MEMS devices, whose phases are controllable without the use of switches or other moving parts, other than the oscillator itself, provides the ability to produce phased array radar systems in a small package, increasing the applications available for such systems.

In further embodiments, the adjustable phase MEMS devices may be used in sonar and ultrasound applications in a similar manner. Further, acoustic or radio frequency emitters may also be formed.

Figure 8:
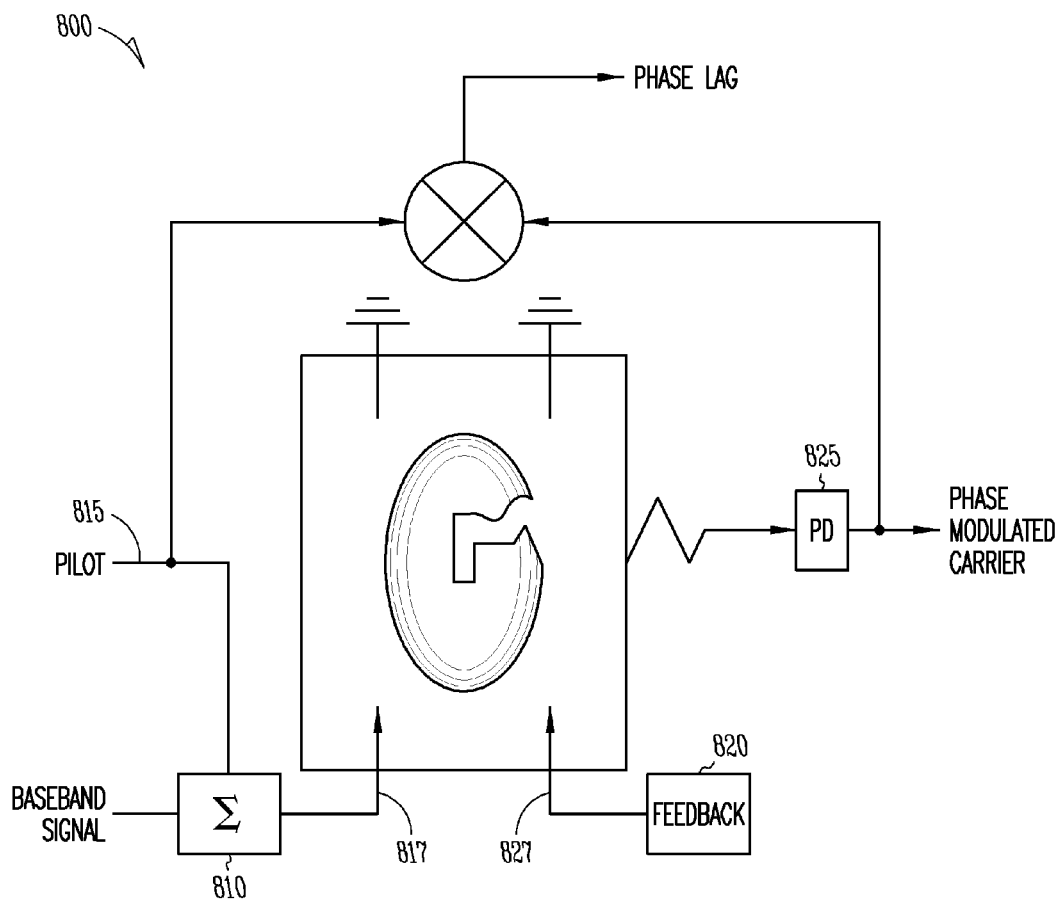
FIG. 8 is a block diagram of a system 800 for modulating the phase or frequency of a micromechanical reference oscillator according to an example embodiment.

FIG. 8 is a block diagram of a system 800 for modulating the phase or frequency of a micromechanical reference oscillator. Besides the potential for delay line applications, the entrained oscillator can also produce a phase or frequency modulated carrier signal for use in communication systems. In the simplest case, frequency modulation of the oscillators' free running frequency can be achieved by applying a baseband AC signal 810 that will perturb the resonators fundamental frequency. The low-frequency bias causes $f_o$ to change, creating a carrier frequency, $f_{FR}$, which is modulated at the rate of the baseband signal on the resistor. The depth of the modulation superimposed on the carrier is defined by the Hz/Volt transfer function of the resistive actuator and resonator mode. To eliminate adder circuitry and achieve better isolation between the baseband signal and the carrier signal, the baseband signal can be applied to a second resistive actuator. In one embodiment, frequency modulation of a 26 MHz carrier by a 30 kHz baseband signal may be used with a modulation depth of 15 kHz. A spectrum analyzer with a high video bandwidth, centered on the carrier frequency, may be used to demodulate the carrier.

Phase modulation may be obtained by superimposing a baseband AC signal onto a pilot 815 microheater 817 while the resonator is self-generating and entrained by the pilot signal 810. Positive feedback 820 from a photodiode 825 is provided by a microheater 827, while the microheater 817 is used to entrain the resonator with the pilot as well as supply the AC baseband signal. The time varying baseband signal, through the additional heat dissipated in the resistive actuator, pulls the natural mechanical frequency across the pilot frequency. Detuning the resonator causes a time varying phase difference between the pilot signal and the feedback signal that is proportional to the time varying baseband amplitude. The phase modulated carrier signal can be sampled from the oscillator feedback with an I/Q demodulator. Phase modulation of a 26 MHz carrier by a 20 kHz baseband signal may be obtained with a modulation depth of 160°. Many different carrier frequencies and baseband signals may be used in various embodiments.

CONCLUSION

Using the non-linear dynamics of a micron-sized mechanical oscillator, a frequency source may be provided with the ability to tune the phase and frequency of the output signal. By controlling the intrinsic resonant frequency of an injection locked micromechanical oscillator through a variety of methods, one can produce (depending on the implementation) continuous phase or frequency shifts in the output signal. An array of similar resonators may be locked to a single, highly stable, frequency source (common in the HF or VHF frequency range) and individually detuned with a separate signal. Upconversion to the EHF frequency range for radar applications may be done using a single source following the mechanical phase tuning stage.

Silicon based MEMS tunable oscillators provide an alternative to discrete components in communication architectures such as quartz crystal frequency sources or voltage controlled oscillators. A high Q, tunable frequency source, such oscillators may be readily incorporated into standard integrated circuit fabrication processes, a critical step toward the realization of integrated radio-on-chip communication systems. Such an implementation where both the frequency and the phase of a micromechanical oscillator can be electronically continuously controlled offers the possibility for highly integrated signal processing schemes.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. A phased array system comprising:
   an array of microelectromechanical independently phase modulated resonators;
   an exciter to drive the resonators in the array to resonate at their resonant frequencies, wherein each resonator is coupled to an antenna to transmit and receive signals;
   a receiver coupled to receive signals from the resonators; and
   a circulator coupled between the array and the exciter and receiver to control signal propagation direction.

2. The system of claim 1 wherein the resonators are selected from the group consisting of a disc supported by a pillar, a cantilevered beam and a bridge.

3. A phased array system comprising:
   an array of microelectromechanical independently phase modulated resonators;
   an exciter to drive the resonators in the array to resonate at their resonant frequencies, wherein each resonator is coupled to an antenna to transmit and receive signals;
   a receiver coupled to receive signals from the resonators; and
   a variable phase element coupled to each resonator.

4. The system of claim 3 wherein the variable phase element is to control phase change over the array to shape and control radar beams.

5. The system of claim 4 wherein the phase is controlled to change linearly across the array.

6. The system of claim 4 wherein the phase is controlled to provide two sets of linear phases.

7. The system of claim 4 wherein the phase is controlled to follow objects moving in different directions.

8. The system of claim 3 wherein each phase modulated resonator includes a high power amplifier to provide signals for transmitting via the antenna, and includes a low noise amplifier to amplify signals received from the antenna.

9. The system of claim 8 wherein each phase modulated resonator further includes a circulator to control signal propagation direction to and from the antenna.

10. A phased array system comprising:
    an array of modules having microelectromechanical independently phase modulated resonators, each module including a phase modulating element, a high power amplifier to provide signals to be transmitted from an antenna, and a low noise amplifier to amplify signals received from the antenna;
    an exciter coupled to the modules via a feed network to drive the resonators in the array to resonate at their resonant frequencies; and
    a receiver coupled to receive signals from the resonators.

11. The system of claim 10 wherein the phased array system is a phased array radar system.

12. The system of claim 10 wherein each module further includes a switch to select between the low noise amplifier and the high power amplifier.

13. The system of claim 10 wherein the resonators are selected from the group consisting of a disc supported by a pillar, a cantilevered beam and a bridge.

14. The system of claim 3 wherein the variable phase element is to control phase change over the array to shape and control radar beams.

15. The system of claim 4 wherein the phase is controlled to change linearly across at least a portion of the array.

16. A method comprising:
    coupling an exciter to an array of microelectromechanical independently phase modulated resonators to drive the resonators in the array to resonate at their resonant frequencies;
    controlling phase changes over the array of resonators;
    transmitting signals from the resonators via an antenna to shape and control beams as a function of the phase changes; and
    receiving signals via the antenna.

17. The method of claim 16 wherein the phase is controlled to change linearly across the array.

18. The method of claim 16 wherein the phase is controlled to provide two sets of linear phases.

19. The method of claim 16 wherein the phase is controlled to follow objects moving in different directions.

* * * * *

UNITED STATES PATENT AND TRADEMARK OFFICE
CERTIFICATE OF CORRECTION

PATENT NO. : 8,049,580 B2
APPLICATION NO. : 12/938126
DATED : November 1, 2011
INVENTOR(S) : Robert B. Reichenbach et al.

It is certified that error appears in the above-identified patent and that said Letters Patent is hereby corrected as shown below:

ON THE TITLE PAGE:
Item (75), in "Inventors", in column 1, line 3, delete "Springs," and insert -- Spring, --, therefor.

IN THE SPECIFICATIONS:
In column 2, line 58, delete ") f/f~$10^{-4}$" and insert -- $\Delta f/f \sim 10^{-4}$ --, therefor.

In column 2, line 59, delete "($P_{laser}$100:W)" and insert -- ($P_{laser}$100 μW) --, therefor.

In column 3, line 67, delete "$F_{\omega_o} \propto V_{RF}^2/R \propto V_{DC}V_o \sin(\omega_o t)/R,\qquad (1)$"
and insert -- $F_{\omega_o} \propto \Delta T \propto V_{RF}^2/R \propto V_{DC}V_o \sin(\omega_o t)/R, \qquad (1)$ --, therefor.

In column 4, line 39, delete "$f_o$" and insert -- $f_o$, --, therefor.

Signed and Sealed this
Twenty-ninth Day of May, 2012

David J. Kappos
*Director of the United States Patent and Trademark Office*